United States Patent [19]

Sorel et al.

[11] Patent Number: 4,465,206

[45] Date of Patent: Aug. 14, 1984

[54] DEVICE FOR THE SIMULTANEOUS MOUNTING OF COMPONENTS ON A CARRIER

[75] Inventors: Alain Sorel, Les Baux Ste Croix; Michel Bury, Evreux, both of France

[73] Assignee: U.S. Philips Corporation, New York, N.Y.

[21] Appl. No.: 494,688

[22] Filed: May 17, 1983

Related U.S. Application Data

[63] Continuation of Ser. No. 226,261, Jan. 19, 1981, abandoned.

[30] Foreign Application Priority Data

Jan. 21, 1980 [FR] France ................................ 80 01216

[51] Int. Cl.³ .............................................. B65H 3/44
[52] U.S. Cl. ...................................... 221/94; 221/278
[58] Field of Search ................. 29/840, 740, 743, 757, 29/809; 221/278, 279, 120, 130, 94

[56] References Cited

U.S. PATENT DOCUMENTS

| 3,742,577 | 7/1973 | Buttriss .......................... 227/120 X |
| 4,091,981 | 5/1978 | Moriguchi et al. ............. 227/130 X |
| 4,127,432 | 11/1978 | Kuwano et al. .................. 29/740 X |
| 4,252,261 | 2/1981 | Klaus et al. ......................... 227/130 |
| 4,253,598 | 3/1981 | Haytayan ........................ 227/130 X |
| 4,292,116 | 9/1981 | Takahashi et al. ............... 29/743 X |
| 4,375,126 | 3/1983 | Düll et al. . |

*Primary Examiner*—Mark Rosenbaum
*Assistant Examiner*—Carl J. Arbes
*Attorney, Agent, or Firm*—David R. Treacy

[57] ABSTRACT

Electronic components are mounted on a substrate from thin-walled magazines which are arranged in a configuration corresponding to a desired implantation of the components. Stacks of components are pushed upwards in the magazines by a pulse of compressed gas in order to press the components against the substrate which has been arranged over the magazines with conductor tracks facing downwards. Local application of an adhesive solder paste to the substrate causes the component on the top of each stack to adhere to and be lifted simultaneously with the substrate.

2 Claims, 7 Drawing Figures

DEVICE FOR THE SIMULTANEOUS MOUNTING OF COMPONENTS ON A CARRIER

This is a continuation, of application Ser. No. 226,261, filed Jan. 19, 1981 now abandoned.

BACKGROUND OF THE INVENTION

The invention relates to a method of mounting a plurality of electronic components on a surface of a carrier comprising conductor tracks, utilizing tubular magazines which comprise an upper opening and a lower opening, each magazine containing a stack of components. These magazines are usually arranged in a configuration which is identical to that desired for the components on the carrier. After positioning of the conductor tracks of a carrier so that they correspond to the upper openings of the magazines, the components in each magazine are lifted so that the uppermost component comes to rest against the carrier.

The invention also relates to a device for performing the described method, comprising tubular magazines, each of which contains a stack of components which is supported by a sliding member.

The components for electronic circuits can be subdivided into two general types: components which are flatly arranged on a carrier and components comprising electrical conductors which are passed through holes in the carrier.

The present invention concerns the mounting of components of the first type. The invention relates essentially to the mounting of the components on carriers which are referred to as "substrates" in order to form circuits which are referred to as "hybrid" circuits. The commercially available machines for assembling the hybrid circuits utilize robots which grip the components in a magazine and position the components on the carrier or substrate according to a program and by means of a more or less complex mechanism. The process is sequential, which means that the components are mounted one after the other, either successively by the same robot or at successive stations in an assembly line. These machines have the drawback that they are expensive, difficult to program and comparatively slow because of the sequential process.

Another method of mounting is known from U.S. Pat. No. 4,127,432. This method utilizes vertical tubular magazines in which stacks of components are pushed upwards by means of rods which are moved upwards by way of springs. These rods are permanently arranged in a given configuration, preferably in a regular network. Therefore, the components themselves also have to be arranged according to a grid having the same pitch as the network of rods. However, the section of the magazines may not be larger than the pitch of the network. Thus, there is a drawback in that, if a large pitch is chosen, a large amount of surface area will remain be mounted. Moreover, the springs exert the same force, regardless of the weight of the components.

SUMMARY OF THE INVENTION

The present invention has for its object to mitigate the drawbacks described above. It is based on the idea to press the components by means of compressed air.

According to the invention, a method of simultaneously mounting components on a carrier is characterized in that the lower opening of each tubular magazine is connected to a source of a fluid, the mounting of the components being realized by means of an overpressure of the fluid. This offers the advantage that the magazines can be arranged in any desirable configuration, without having to follow a regular network, so that the space available on the substrates is better utilized and components of various dimensions can be mounted. Moreover, the force applied is larger as the surface of the component is larger, so in general as the component is heavier.

A method in accordance with the invention is also characterized in that the overpressure is simultaneously applied to all tubular magazines, so that time is gained.

A device in accordance with the invention is characterized in that it comprises a gastight housing whereto compressed gas is applied and into which the lower openings of the magazines open.

This arrangement enables the lower opening of each magazine to be very easily connected to the source of fluid. Preferably, the magazines in accordance with the invention comprise thin walls and their transverse section corresponds to the shape of the components inside the magazine. The advantage of very thin walls for the magazine tubes consists in that the tubes can thus be arranged side by side without much space being lost and in that, therefore, there may be as many tubes as there are components to be positioned, so that during a single operation all components can be positioned according to a configuration with a density which is not limited by the device; a large amount of time is thus saved.

In a special embodiment, a device in accordance with the invention comprises an upper plate which constitutes the lid of the gastight housing and which has holes arranged in a configuration which is identical to that desired for the components on the carrier, the upper ends of the magazines contained in the housing passing through these holes. Preferably, the plate also includes means for positioning the conductor tracks of the carrier so that they correspond to the upper openings of the magazines.

This arrangement enables all functions necessary for performing the method to be simply realized.

A further embodiment of a device in accordance with the invention is characterized in that on the gastight housing there is mounted a block of an elastomer material which constitutes the lid of the housing, which maintains the magazines arranged according to a configuration which is identical to that desired for the components on the carrier, and which comprises means for positioning the conductor tracks of the carrier so that they correspond to the upper openings of the magazines.

This embodiment enables the use of a smaller housing and hence a smaller gas volume and a better controlled overpressure.

The invention will be described in detail hereinafter with reference to the accompanying diagrammatic drawing.

DESCRIPTION OF THE PREFERRED EMBODIMENTS

Figure 1:
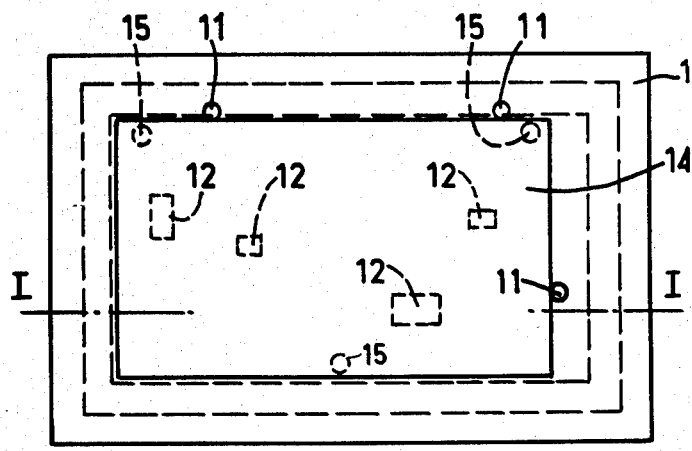
FIG. 1 is a plan view of a device in accordance with the invention.
Figure 2:
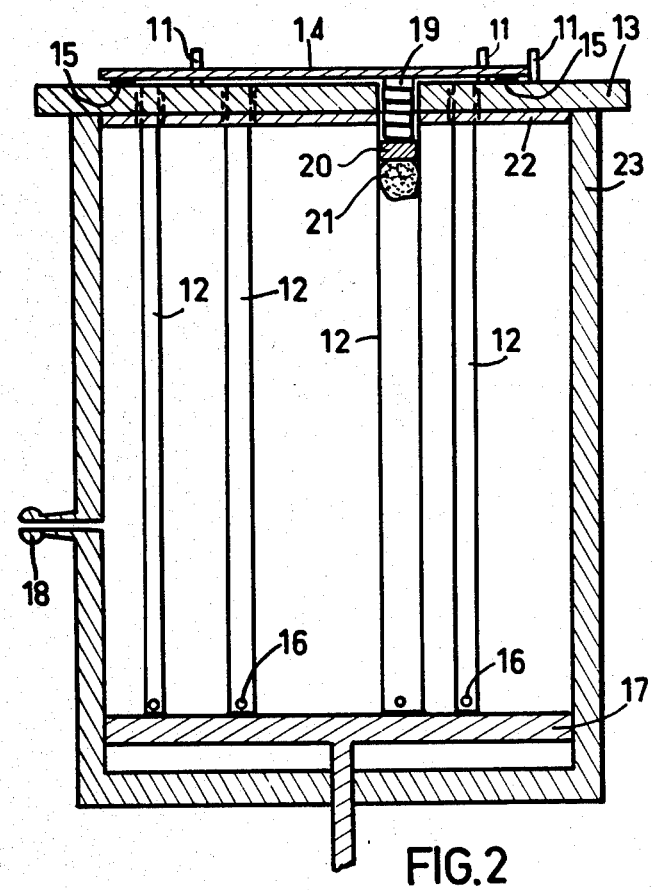
FIG. 2 is a sectional view, taken along the line I—I of the device shown in FIG. 1.
Figures 3, 4:
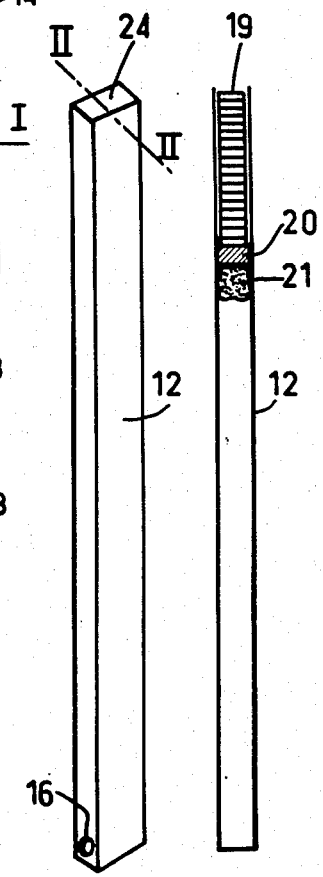
FIG. 3 is a perspective view of a tubular magazine.
FIG. 4 is a sectional view, taken along the line II—II, of the magazine shown in FIG. 3.

As appears from the FIGS. 1, 2 and 3, a method of mounting a plurality of electronic components 19 on a surface of a carrier 14, which is also referred to as a substrate and which is provided with conductor tracks, utilizes tubular magazines 12 which comprise an upper opening 24 and a lower opening 16 and each of which contains a stack of components 19, these magazines being arranged according to a configuration which is identical to that desired for the components on the carrier. This configuration is referred to in general as an implantation. Subsequently, the substrate 14 is arranged, its conductor tracks facing downwards, against the spacers 15 and the abutments 11 which are situated so that the conductor tracks on the substrate for the soldering of the components face the upper openings of the corresponding magazines. Subsequently, the components 19 of each magazine are lifted so that the top component 19 comes to rest against the carrier 14. To this end, the lower opening 16 of each tubular magazine 12 is connected to a fluid source and the lifting of the components 19 is realized by means of an overpressure of said fluid which is simultaneously applied to all tubular magazines 12.

The downwards facing conductor tracks of the carrier 14 have been provided, in advance, for example by the silk-screen process, with a reflow soldering paste at the areas where an electrical connection is to be established; because of its additional property that it is adhesive, this paste enables the components 19 to be retained against the carrier 14 in the desired configuration when pressing of the stack of components 19 is subsequently terminated by removing the fluid overpressure. The carrier 14 can then be lifted; it will then take along one component 19 per magazine, each component being retained by the soldering paste. Subsequently, the carrier is turned over so that the conductor tracks and the components face upwards, after which the carrier is transported to a station for reflowing the soldering paste.

The device shown in the FIGS. 1 and 2 comprises tubular magazines 12 which are shown in more detail in the FIGS. 3 and 4. Each magazine contains a stack of components 19 which are supported by a sliding follower member 20, 21 which maintains the stack of components in their lifted position. after termination of the fluid overpressure, because of friction between the follower member and the walls of the magazine. This member is formed, for example, by an expanded block of polystyrene 20 associated with a textile plug 21.

The device also comprises a gastight housing 23 which receives compressed gas via a tube 18 and into which the lower openings 16 of the magazines open. These magazines have very thin walls, and their transverse section corresponds to the shape of the components contained in the magazine.

The device also comprises an upper plate 13 which constitutes the lid of the gastight housing 23. The plate 13 has holes arranged according to a configuration which is identical to that desired for the components on the carrier, the upper openings 24 of the magazines contained in the housing 23 opening through said holes, The lid or plate also includes means formed by abutments 11 and spacers 15 for positioning the conductor tracks of the carrier so that they correspond to the upper openings of the magazines.

The spacers 15 serve to prevenz soiling of the plate 13 by soldering paste, deposited in advance on the carriers 14, by keeping the carriers from the plate 13 at a distance equal to approximately one third of the height of the thinnest components.

The abutments 11 enable horizontal positioning of the carrier 14 which is pressed downwards, for example, by hand.

During the preparation of the device, the tubular magazines 12 are inserted downwards with some friction in the holes of the plate 13 until their lower extremity rests on a platform 17 which supports the magazines so that their upper opening is level with the top of the plate 13. A seal 22 provides gastight sealing between the tubular magazines and the plate. This seal can be realized by arranging the device upside down and by subsequently pouring a small quantity of elastomer resin which is elastic as well as hardly adhesive after polymerisation.

The platform 17, being slidable in the housing 23, enables the magazines 12 to be extracted through the plate 13 when these magazines, or one of them, are empty and have to be filled with components. Filling takes place at a separate station which comprises, for example, a vibrating feeder and suitable troughs. The use of an elastomer silicon seal 22 instead of a glued or soldered joint enables the sliding of the magazines 12 through the holes in the plate 13.

Thus, for each type of circuit to be manufactured there will be one type of plate 13 and per component to be used there will be one magazine 12, regardless of the circuit for which the component is intended. The same magazines can be mounted in different plates according to the need.

Figure 5:
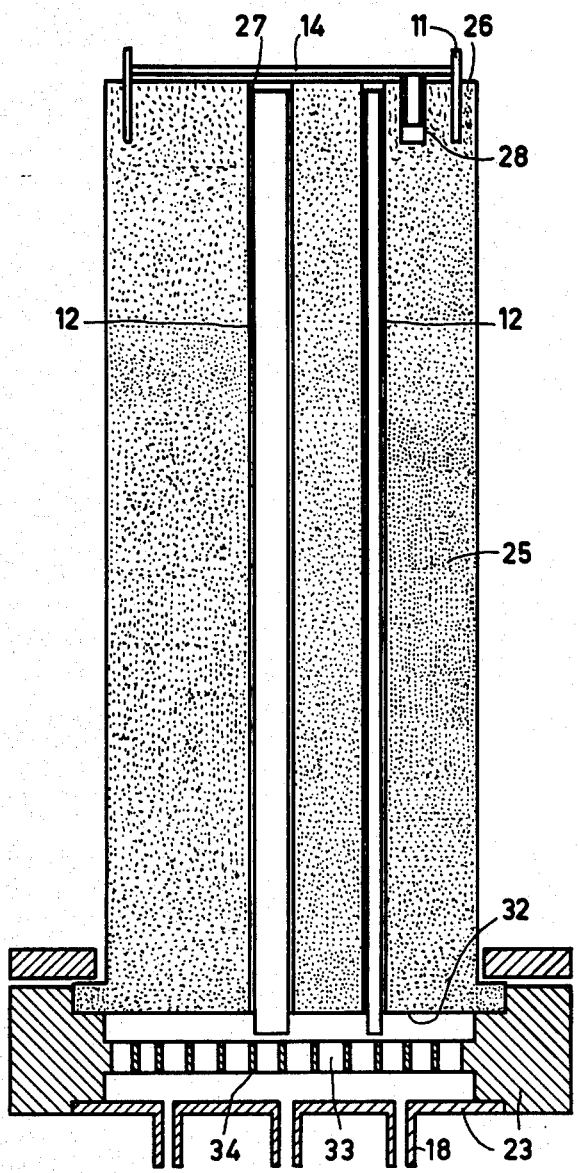
FIG. 5 is a sectional view of a further embodiment of a device in accordance with the invention.

FIG. 5 shows a further embodiment of a device in accordance with the invention where on the gastight housing 23 there is mounted a block 25 of an elastomer material which constitutes the lid of the housing, which keeps the magazine 12 arranged according to a configuration which is identical to that desired for the components on the carrier, and which comprises means 11, 28 for positioning the conductor tracks of the carrier so that they correspond to the upper openings of the magazines.

Thus, for each type of circuit to be realized there is one type of block of elastomer material containing the magazines. These blocks can be very quickly replaced when the type of circuit is changed. However, the magazines are very vulnerable and it is better to fill the magazines without removal from the block. In order to facilitate this operation, each upper end 27 is situated slightly below the upper surface of the elastomer block. As a result, the lower end of a tube (not shown) which is filled with components and which is identical to that moulded in the block can be inserted and positioned in order to push the components from the full tube into the empty magazine tube. The magazines 12 are simply cut from a tube of long length, so that they do not have a bottom. The hole 16 of FIG. 3 is not required, because there is no piston 17 which closes the bottom of the tubes.

In order to realize this elastomer block, a mold is made (not shown). The surfaces of the mold which correspond to the upper surface 26 and the lower surface 32 of the block 35 to be molded comprise, in the appropriate positions, shoulders which have a section adapted to the interior section of the magazine tubes to be positioned and which sink into these tubes in order to keep the magazines in position during molding. One of the surfaces also carries rods for forming recessed holes in which the abutments 11 and telescopic means 28 are pressed. It is to be understood that only these surfaces of the molds are specific to a given model of the substrate to be provided with components, the remainder of the equipment being universal.

The housing 23 also includes an interior wall 34 with holes 33 which are provided very near to each other and which form a kind of honeycomb plate. This plate serves to divide the compressed air into parallel channels or streams in order to obtain a set of jets of air which are substantially parallel and which better penetrate the magazine tubes. The air is supplied through a number of tubes 18 so that the pressure which is realized by means of brief pressure impulses is distributed as regularly as possible.

Figure 6:
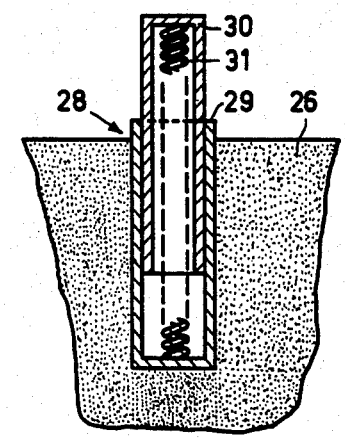
FIG. 6 shows a detail of FIG. 5 at an increased scale.

FIG. 6 shows a telescopic ejection means 28. It consists of two cylinders 29, 30 which telescopically slide into one another and which are pressed apart by a spring 31. The cylinders are arranged in the upper surface of the block 25 in positions corresponding to unused areas of the carrier 14.

The outer cylinder 29 is fixed in the elastomer material. The slidable inner cylinder 30 constitutes a part which is moved to an upper position by spring force and which assists the lifting of carrier when the mounting of the components on the carrier has been completed. The fixed outer cylinder projects slightly from the upper surface 26 of the elastomer block so that when the inner cylinder 30 is in its lower position, there is a projecting portion which keeps the carrier at a distance from the upper surface of the block which equals approximately one third of the height of the thinnest component, as has already been described for the embodiment shown in the FIGS. 1, 2 and 3. This telescopic system can be used for all embodiments in accordance with the invention, notably when the carriers or substrates 14 are positioned on the device by hand.

Figure 7:
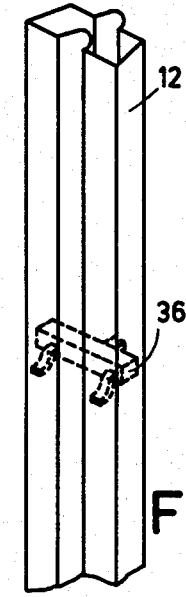
FIG. 7 is a perspective view of a special tubular magazine.

Finally, FIG. 7 shows a special embodiment of a tubular magazine 12, illustrating the possibility of adapting the thin walls to the shape of the components. The component 36, shown in broken line, is a miniature transistor. Magazines of this kind enable the components to be positioned substantially as near to one another as desired.

What is claimed is:

1. A device for placing a plurality of components against a carrier in a given configuration, comprising a plurality of tubular magazines formed with thin walls and adapted to contain respective stacks of components, each magazine having an open top end, an opening adjacent the other end, and transverse sections corresponding to the cross-section shape of the components to be contained therein, a follower member disposed in each magazine arranged to have a friction fit with respect to walls of the magazine, an element having an upper surface and a lower surface and holes extending from said upper to said lower surfaces, said plurality of magazines being disposed in said holes substantially parallel to each other, with their top ends arranged in said given configuration adjacent said upper surface, a fluid-tight housing arranged so that said element forms a housing cover, said element being a plate having holes arranged in said given configuration, said magazines passing through said holes with top ends of said magazines being adjacent said holes; said housing and cover enclosing a space, said openings adjacent the other end of each magazine communicating with said space; and said plate further including means for positioning a carrier in aligned relationship with and adjacent said open top ends, means for admitting a fluid under pressure into said space below said follower members, for pressing the top component of each stack against a carrier which has been positioned adjacent said open ends, and a platform arranged within said fluid-tight housing for sliding movement arranged such that by sliding the platform the magazines may be extracted through the plate.

2. A device for placing a plurality of components against a carrier in a given configuration, comprising a plurality of tubular magazines adapted to contain respective stacks of components, each magazine having an open top end and an opening adjacent the other end, a follower member disposed in each magazine arranged to have a friction fit with respect to walls of the magazine, an element having an upper surface and a lower surface and holes extending from said upper to said lower surfaces, said plurality of magazines being disposed in said holes substantially parallel to each other, with their top ends arranged in said given configuration adjacent said upper surface, a fluid-tight housing arranged so that said element forms a housing cover, said housing and cover enclosing a space, said openings adjacent the other end of each magazine communicating with said space, means for positioning a carrier in aligned relationship with and adjacent said open top ends, and means for admitting a fluid under pressure into said space below said follower members, for pressing the top component of each stack against a carrier which has been positioned adjacent said open ends, characterized in that said element is a block of an elastomer material arranged to constitute a cover of the housing, said magazines passing through and being supported in the desired arrangement by said elastomer which thereby positions said magazines, said means for positioning said carrier includes elements embedded partially in said elastomer, and said device further comprises at least one ejection element arranged to correspond to a reference point on a carrier, said ejection element including at least one portion moved by a spring force from a lower position to an upper position and a further portion of said element which projects slightly when said first mentioned portion is in the lower position.

* * * * *